United States Patent
Lee et al.

(10) Patent No.: US 11,906,451 B2
(45) Date of Patent: Feb. 20, 2024

(54) METHOD AND SYSTEM FOR NON-DESTRUCTIVE METROLOGY OF THIN LAYERS

(71) Applicants: Nova Ltd., Rehovot (IL); GLOBALFOUNDRIES U.S. INC., Santa Clara, CA (US)

(72) Inventors: Wei Ti Lee, San Jose, CA (US); Heath A. Pois, Fremont, CA (US); Mark Klare, Poughkeepsie, NY (US); Cornel Bozdog, Boise, ID (US); Alok Vaid, Ballston Lake, NY (US)

(73) Assignees: Nova Ltd., Rehovot (IL); GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/448,081

(22) Filed: Sep. 20, 2021

(65) Prior Publication Data
US 2022/0074878 A1    Mar. 10, 2022

Related U.S. Application Data

(63) Continuation of application No. 15/845,313, filed on Dec. 18, 2017, now abandoned, which is a
(Continued)

(51) Int. Cl.
*G01N 23/2273*     (2018.01)
*H01L 21/66*        (2006.01)
(Continued)

(52) U.S. Cl.
CPC ......... *G01N 23/2273* (2013.01); *G01B 11/06* (2013.01); *G01B 15/02* (2013.01);
(Continued)

(58) Field of Classification Search
CPC .................................................. G01N 23/2273
See application file for complete search history.

(56) References Cited

U.S. PATENT DOCUMENTS

| 6,041,096 A | 3/2000 | Doi et al. |
| 8,774,359 B1 | 7/2014 | Zhuang et al. |
| (Continued) | | |

OTHER PUBLICATIONS

Browne, et al., Combined microscope for scanning X-ray transmission and surface topography, Ultramicroscopy, 2002, pp. 221-232, vol. 92.
(Continued)

*Primary Examiner* — Hyun D Park
(74) *Attorney, Agent, or Firm* — Reches Patents

(57) ABSTRACT

A monitoring system and method are provided for determining at least one property of an integrated circuit (IC) comprising a multi-layer structure formed by at least a layer on top of an underlayer. The monitoring system receives measured data comprising data indicative of optical measurements performed on the IC, data indicative of x-ray photoelectron spectroscopy (XPS) measurements performed on the IC and data indicative of x-ray fluorescence spectroscopy (XRF) measurements performed on the IC. An optical data analyzer module analyzes the data indicative of the optical measurements and generates geometrical data indicative of one or more geometrical parameters of the multi-layer structure formed by at least the layer on top of the underlayer. An XPS data analyzer module analyzes the data indicative of the XPS measurements and generates geometrical and material related data indicative of geometrical and material composition parameters for said layer and data indicative of material composition of the underlayer. An XRF data analyzer module analyzes the data indicative of the XRF measurements and generates data indicative of amount of a predetermined material composition in the
(Continued)

multi-layer structure. A data interpretation module generates combined data received from analyzer modules and processes the combined data and determines the at least one property of at least one layer of the multi-layer structure.

20 Claims, 7 Drawing Sheets

Related U.S. Application Data continuation-in-part of application No. PCT/US2016/060147, filed on Nov. 2, 2016.

(60) Provisional application No. 62/249,845, filed on Nov. 2, 2015.

(51) Int. Cl.
 *G01B 11/06* (2006.01)
 *G01B 15/02* (2006.01)
 *G01N 23/2208* (2018.01)
 *G01N 23/223* (2006.01)

(52) U.S. Cl.
 CPC ....... *G01N 23/223* (2013.01); *G01N 23/2208* (2013.01); *H01L 22/12* (2013.01); *G01N 2223/305* (2013.01); *G01N 2223/61* (2013.01); *G01N 2223/633* (2013.01)

(56) References Cited

U.S. PATENT DOCUMENTS

| | | | |
|---|---|---|---|
| 2005/0079720 A1 | 4/2005 | Aoyama et al. | |
| 2006/0243904 A1* | 11/2006 | Schueler | G01B 15/02 250/305 |
| 2008/0290780 A1 | 11/2008 | Kuroda et al. | |
| 2011/0210246 A1 | 9/2011 | Cohen | |
| 2011/0233398 A1 | 9/2011 | Martinez et al. | |
| 2012/0274757 A1 | 11/2012 | Bai et al. | |
| 2015/0032398 A1* | 1/2015 | Peterlinz | G01N 23/203 702/81 |
| 2015/0198435 A1 | 7/2015 | Vaid et al. | |
| 2015/0308969 A1 | 10/2015 | Pois et al. | |

OTHER PUBLICATIONS

Jun. 23, 2022, Official Action and Search Report, Chinese Appln. No. 201680077602.4.

* cited by examiner

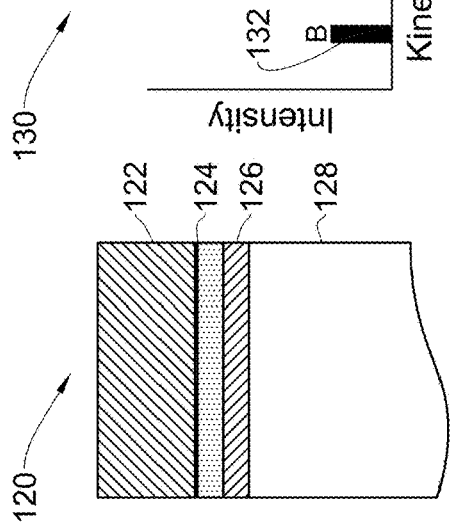
FIG. 1C
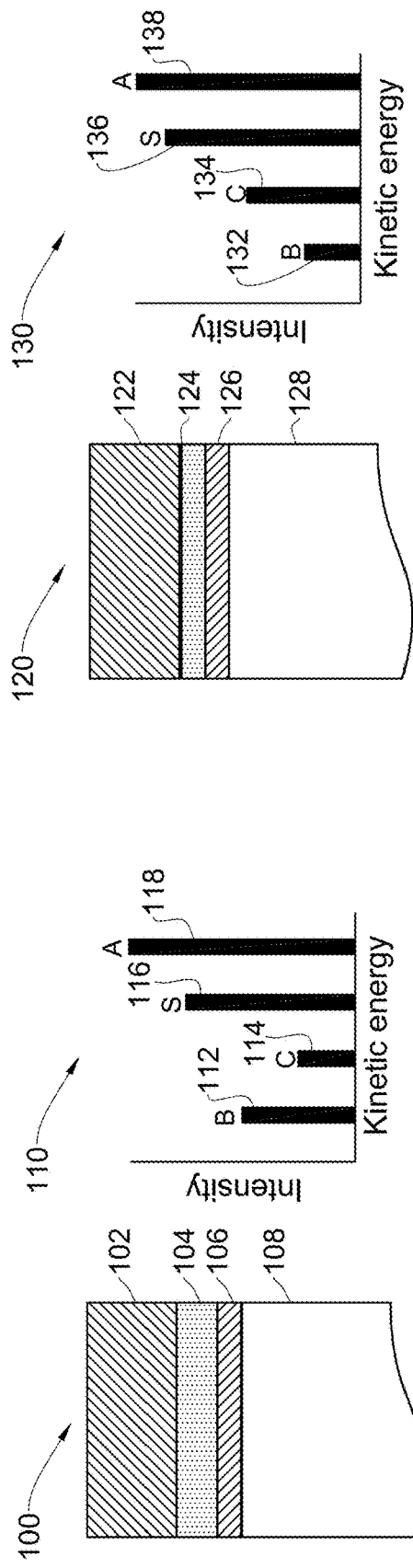
FIG. 1A
FIG. 1B
FIG. 1D
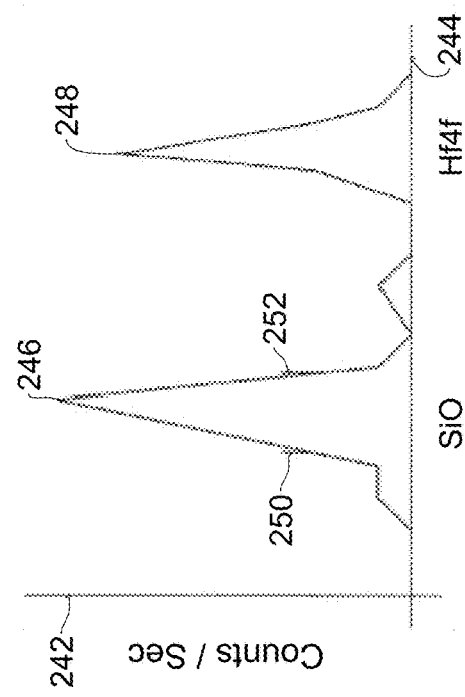
FIG. 2C
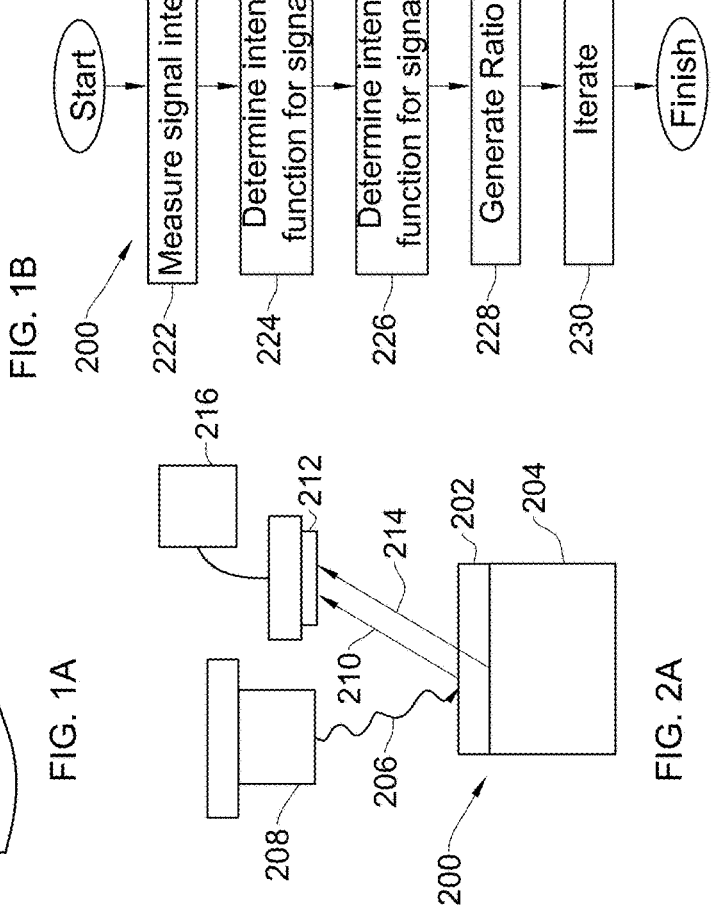
FIG. 2A
FIG. 2B Full Equations for Hf, Si-O and Si $$I_{Hf} = \frac{1}{K_{Hf}G_{Top}}\left[1 - e^{\frac{-t_{HfO2}}{\lambda_{Hf.HfO2}}}\right]$$

$$+ \frac{2}{K_{Hf}+G_{Sidewall}}\left(\left[1-e^{\frac{-t_{HfO2}}{\lambda_{Hf.HfO2}}}\right]+\left[1-e^{\frac{-t_{HfO2}}{\lambda_{Hf.HfO2}}}\right]e^{\frac{-2t_{SiO2}}{\lambda_{Hf.SiO2}}}e^{\frac{-TCD_{fin}}{\lambda_{Hf.Si}}}e^{\frac{-t_{HfO2}}{\lambda_{Hf.HfO2}}}\right)$$

$$+ \frac{1}{K_{Hf}+G_{Bottom}}\left[1-e^{\frac{-t_{HfO2}}{\lambda_{Hf.HfO2}}}\right]$$

$$I_{Si-O} = \frac{1}{K_{Si-O}G_{Top}}\left[1-e^{\frac{-t_{SiO2}}{\lambda_{Si-O.SiO2}}}\right]e^{\frac{-t_{HfO2}}{\lambda_{Si-O.HfO2}}}$$

$$+ \frac{2}{K_{Si-O}+G_{Sidewall}}\left(\left[1-e^{\frac{-t_{SiO2}}{\lambda_{Si-O.SiO2}}}\right]e^{\frac{-t_{HfO2}}{\lambda_{Si-O.HfO2}}}+\left[1-e^{\frac{-t_{SiO2}}{\lambda_{Si-O.SiO2}}}\right]e^{\frac{-TCD_{fin}}{\lambda_{Si-O.Si}}}e^{\frac{-t_{HfO2}}{\lambda_{Si-O.HfO2}}}\right)$$

$$+ \frac{1}{K_{Si-O}+G_{Bottom}}e^{\frac{-t_{HfO2}}{\lambda_{Si-O.HfO2}}}$$

$$I_{Si} = \frac{1}{K_{Si}G_{Top}}e^{\frac{-t_{SiO2}}{\lambda_{Si.SiO2}}}e^{\frac{-t_{HfO2}}{\lambda_{Si.HfO2}}}$$

$$+ \frac{2}{K_{Si}+G_{Sidewall}(w,h,p)}\left[1-e^{\frac{-w_{fin}}{\lambda_{Si.Si}}}\right]e^{\frac{-t_{SiO2}}{\lambda_{Si-SiO2}}}e^{\frac{-t_{HfO2}}{\lambda_{Si.HfO2}}}$$

FIG. 4A

Full Equations for Hf, Si-O and Si (continue)

$$G_{Top} = \frac{p}{TCD}$$

$$G_{Sidewall} = \frac{ap}{\sqrt{h^2 + \left(\frac{BCD - TCD}{2}\right)^2}}$$

$$G_{Bottom} = \frac{bp}{p - BCD}$$

Constraints: $TCD \leq BCD < P$ w, p and h can be fed from OCD
Since aspect ratio is relatively low, b~1
Therefore, in the simplest case, the only additional parameter is a.

FIG. 4B

Where:
$$G_{Top} = \frac{cp}{TCD + t_{sidewall}}$$

$$G_{Sidewall} = \frac{ap}{\sqrt{h^2 + \left(\frac{BCD - TCD}{2}\right)^2}}$$

$$G_{Bottom} = \frac{bp}{p - BCD - d*(t_{IL} - t_{HK})}$$

Constraints: $TCD \leq BCD < P$

FIG. 4C

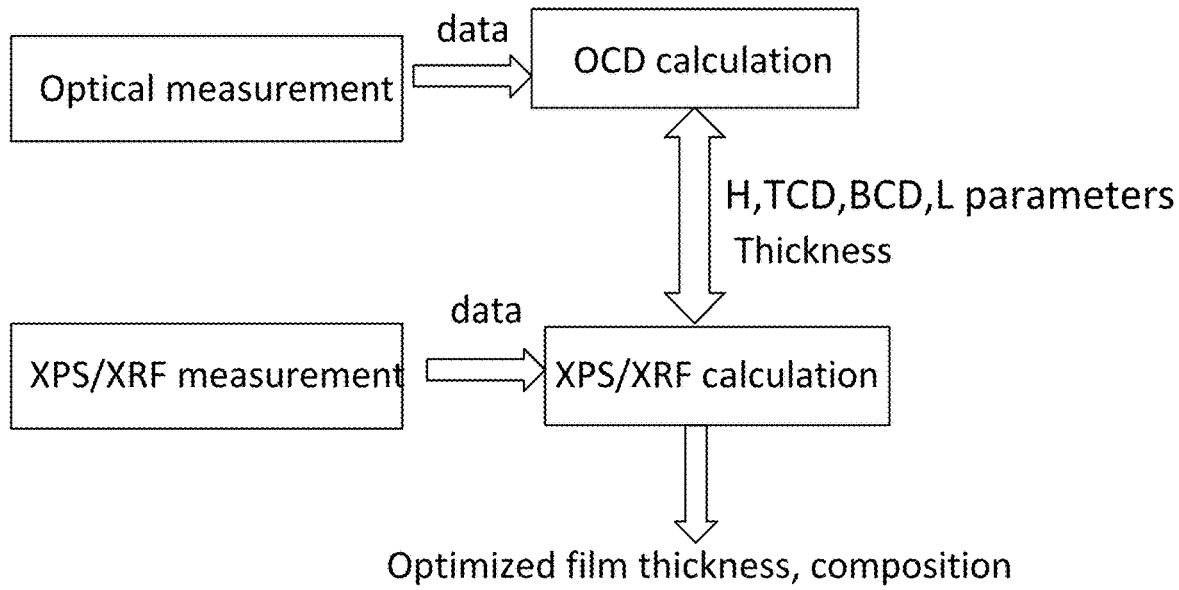

FIG. 5

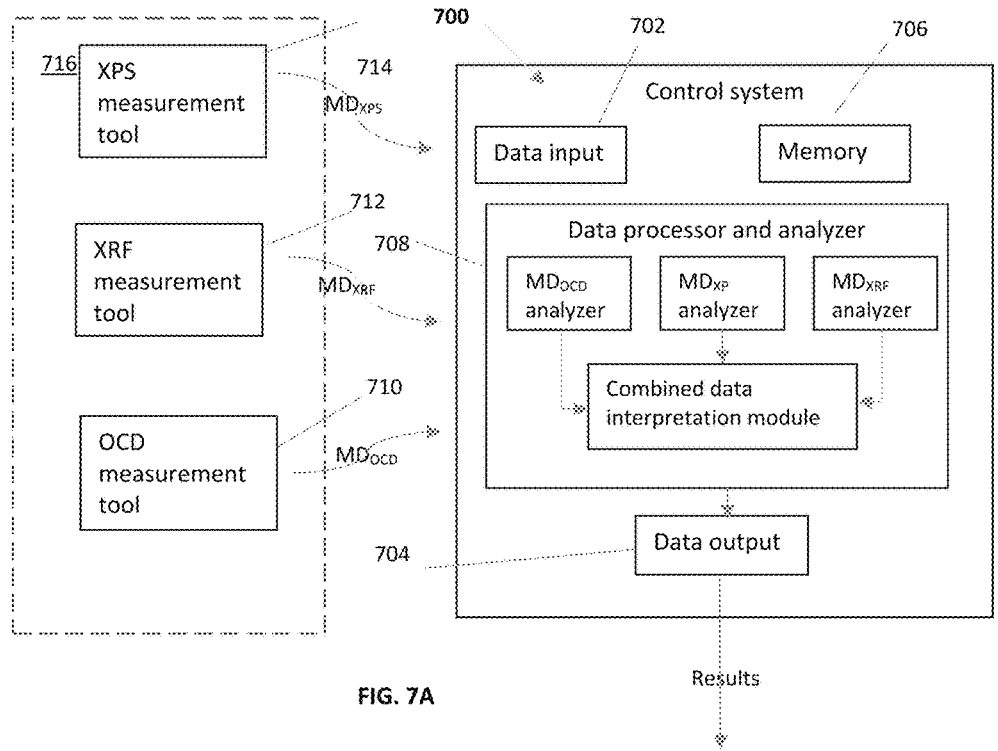
FIG. 7A
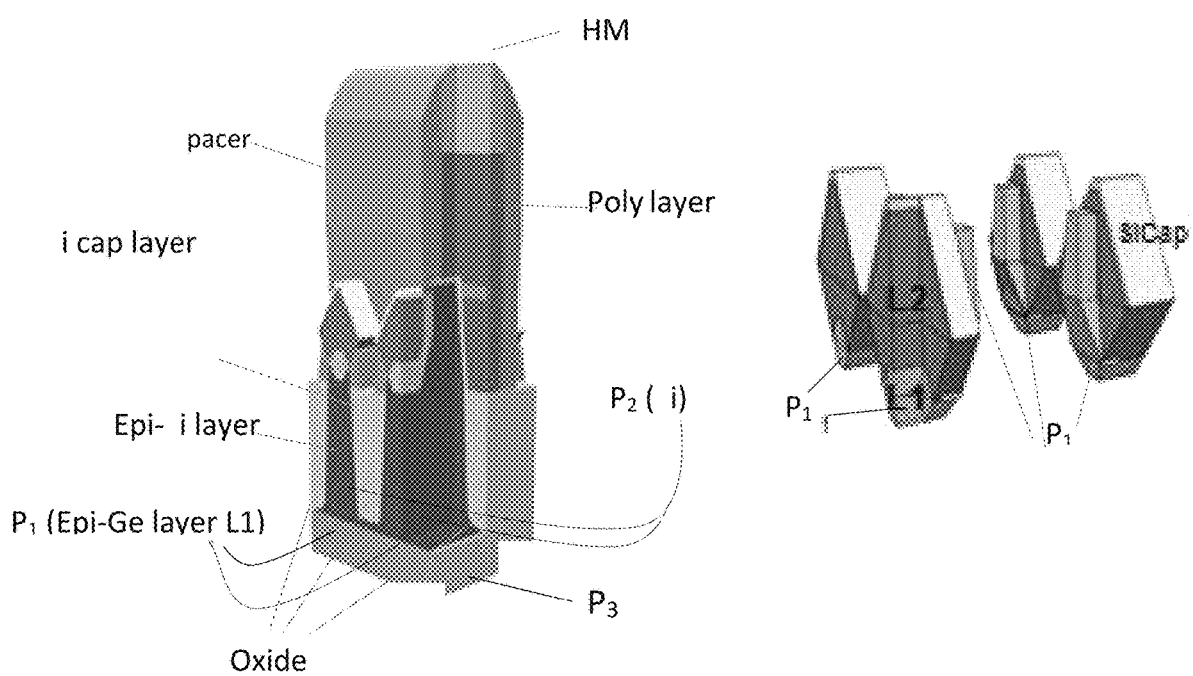
FIG. 7B
FIG. 7C

METHOD AND SYSTEM FOR NON-DESTRUCTIVE METROLOGY OF THIN LAYERS

RELATED APPLICATION

This application is a continuation-in-part of PCT Application No. PCT/US2016/060147, filed Nov. 2, 2016, which claims priority benefit from U.S. Provisional Application No. 62/249,845, filed on Nov. 2, 2015, the disclosures of each of which being hereby incorporated herein by reference in their entirety.

FIELD OF THE INVENTION

The invention generally relates to techniques for examining microelectronic structures and specifically to techniques for measuring layer thickness and composition on structures using photoelectron spectroscopy and x-ray fluorescence.

BACKGROUND

Integrated circuits typically comprise a number of layers formed on a silicon substrate. As integrated circuits become smaller, and the thickness of layers comprising the integrated circuits is reduced, the behavior of devices formed from these layers often depends on the thickness or composition of a specific layer. For example, a transistor formed on a silicon substrate may have different characteristics depending on the thickness or composition of the gate of the transistor. It may therefore be useful to determine a thickness and composition of a layer in a microelectronic device such as an integrated circuit.

The thickness or composition of a layer in a microelectronic device such as an integrated circuit may be determined using one of several techniques. The microelectronic device typically includes a structure including several layers built up over a substrate. Techniques that may be used to determine a thickness and/or composition of a specific layer in a structure include ellipsometry, using an electron probe with wavelength dispersive spectrometer(s), angle-resolved x-ray photoelectron spectroscopy (XPS), and secondary ion mass spectrometry (SIMS).

Angle-resolved XPS uses photoelectron spectroscopy to determine a thickness and/or composition of a layer or multiple layers. Photoelectron spectroscopy bombards a sample with photons having a specific wavelength (here, x-ray photons), which excite the atoms of the sample to generate a photoelectron having a characteristic energy for the sample. The technique depends on measuring photoelectrons at different emission angles from the sample surface, for example by tilting the sample with respect to an electron energy analyzer.

As technologies advance, improved methods for determining thickness and compositions of thin layers are needed.

SUMMARY

The present invention provides a novel monitoring technique for monitoring/determining one or more properties of an integrated circuit (IC) comprising a multi-layer structure; and a hybrid metrology system utilizing this monitoring technique.

According to the technique of the invention, optical measurements (e.g. OCD) are used for optimizing interpretation of XPS and XRF measurements, while all these types of measurements are independently performed on the same structure, i.e. optical, XPS and XRF measured data are independently obtained. These measured data are analyzed using model-based fitting procedures, via mutual optimization of the optical, XPS and XRF data interpretation models, to determine optimized geometrical (e.g. thickness) and material composition parameters of the structure.

Thus, according to one broad aspect of the invention, there is provided a monitoring system for determining at least one property of an integrated circuit (IC) comprising a multi-layer structure formed by at least a layer on top of an underlayer. The monitoring system comprises a computer system comprising data input and output utilities, a memory utility, and a data processor and analyzer utility, wherein:

said data input utility is configured to receive measured data comprising data indicative of optical measurements performed on said IC, data indicative of x-ray photoelectron spectroscopy (XPS) measurements performed on said IC and data indicative of x-ray fluorescence spectroscopy (XRF) measurements performed on said IC;

said data processor and analyzer utility comprising:
an optical data analyzer module configured and operable to analyze said data indicative of the optical measurements and generate geometrical data indicative of one or more geometrical parameters of the multi-layer structure formed by at least the layer on top of the underlayer, an XPS data analyzer module configured and operable to analyze the data indicative of the XPS measurements and generate geometrical and material related data indicative of geometrical and material composition parameters for said layer and data indicative of material composition of the underlayer;

an XRF data analyzer module configured and operable to analyze the data indicative of the XRF measurements and generate data indicative of amount of a predetermined material composition in the multi-layer structure; and a data interpretation module configured and operable for data communication with the optical data analyzer, the XPS data analyzer and the XRF data analyzer modules to generate combined data received from said modules and process the combined data and determine said at least one property of at least one layer of multi-layer structure.

The data interpretation module is configured and operable to utilize the geometrical data of the multi-layer structure and perform data interpretation of the geometrical and material related data and the data indicative of the amount of the predetermined material composition in the multi-layer structure.

In some embodiments, each of the analyzer modules is configured and operable to process the data indicative of the respective measurements by applying to said data a fitting procedure using one or more data interpretation models. The data interpretation module may be configured and operable to perform mutual optimization of the data interpretation models used by the analyzer modules by injecting one or more of geometrical and material composition relating parameters obtained from one of the fitting procedures performed by one of the analyzer modules using the respective data interpretation model into at least one of the other data interpretation models.

In some embodiments, the data indicative of optical measurements comprises optical critical dimensions (OCD)

relating data. The geometrical data generated by the optical data analyzer module may comprise at least thickness parameter of the multi-layer structure.

The geometrical data generated by the XPS data analyzer module may comprise a thickness of said layer, and the material composition related data may comprise the material composition of said layer and a percentage content of said predetermined material composition in the underlayer.

In some embodiments, the computer system is configured for data communication, via a communication network, with one or more measured data providers to receive said measured data. The one or more measured data providers may comprise at least one storage device in which the measured data is stored and to which the computer system has access via the communication network. Alternatively or additionally, the one or more measured data providers may comprise at least one measurement tool configured to perform the respective measurements and collect the measured data.

In some embodiments, the computer system is integral with a measurement tool providing one of said data indicative of optical, XPS and XRF measurements, and is configured for data communication, via a communication network, with one or more measured data providers to receive other measured data from said data indicative of optical, XPS and XRF measurements. For example, the one or more measured data providers comprises at least one measurement tool configured to perform the respective measurements.

According to another broad aspect of the invention, it provides a hybrid metrology system configured for determining at least one property of an integrated circuit (IC) comprising a multi-layer structure formed by at least a layer on top of an underlayer. The hybrid metrology system comprises:
  a measurement system comprising: an optical measurement tool configured for performing optical critical dimension (OCD) measurements on the IC and generating optical measured data; an x-ray photoelectron spectroscopy (XPS) measurement tool for performing measurements on said IC and generating XPS measured data; and an x-ray fluorescence spectroscopy (XRF) measurement tool configured to perform XRF measurements on said IC and generate XRF measured data; and
  the above described monitoring system for receiving and processing the measured data.

The present invention, in its yet further broad aspect, provides a method for use in determining property of an integrated circuit (IC) comprising a multi-layer eSiGe structure formed by at least a Si-cap layer on top of SiGe layers. The method is being carried out by a computer system having data input and output utilities, a memory utility, and a data processor and analyzer utility, and comprises:
  providing and storing in the memory utility measured data comprising first data indicative of optical critical dimension (OCD) measurements performed on said structure, second data indicative of x-ray photoelectron spectroscopy (XPS) measurements performed on said structure, and third data indicative of x-ray fluorescence spectroscopy (XRF) measurements performed on said structure;
  processing the measured data by said processing and analyzing utility, said processing comprising:
  analyzing the first OCD data by applying thereto model-based processing using one or more data interpretation models, and generating geometrical data indicative of at least thickness of the multi-layer structure,
  analyzing the second, XPS data by applying thereto model-based processing using one or more data interpretation models, and generating geometrical and material related data indicative of at least thickness of the Si-cap layer percentage contents of Ge in SiGe layers;
  analyzing the third, XRF data by applying thereto model-based processing using one or more data interpretation models, and generating data indicative of amount of Ge material in said structure; and
  generating and interpreting combined data formed by the geometrical data and the material data and determining the properties of the structure comprising at least the thickness of the SiGe layers.

In some embodiments, the interpretation of the combined data comprises utilizing the thickness of the structure obtained from model-based processing of the OCD measured data and performing data interpretation of the geometrical and material data.

The interpretation of the combined data may comprise mutual optimization of the data interpretation models by injecting one or more of the geometrical and material relating parameters obtained from one of the model-based processing using the respective data interpretation model into at least one of the other data interpretation models.

Other aspects are disclosed by the detailed description with reference to the drawings.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

One or more embodiments of the present invention are illustrated by way of example and not limitation in the figures of the accompanying drawings, in which like references indicate similar elements and in which:

FIGS. 1A-1D illustrate two multi-layer structures and the intensities of different photoelectron signals emitted by the structures when subjected to photoelectron spectroscopy;

FIG. 2A illustrates a layered structure formed on a substrate according to one embodiment of the invention;

FIG. 2B is a flowchart describing a process for determining a thickness and/or composition of a single layer over a substrate;

FIG. 2C illustrates a spectrum of the measured results generated by XPS spectroscopy;

FIG. 4A-4C illustrate generating coefficients to accommodate photon emission from uneven topography;

FIG. 5 is a flowchart describing a process for determining a thickness and/or composition of two of the layers of the uneven structure using the coefficients determined in a hybrid measurement technique;

FIGS. 7A to 7C exemplify a hybrid measurement technique according to the invention.

DETAILED DESCRIPTION

Figure 3:
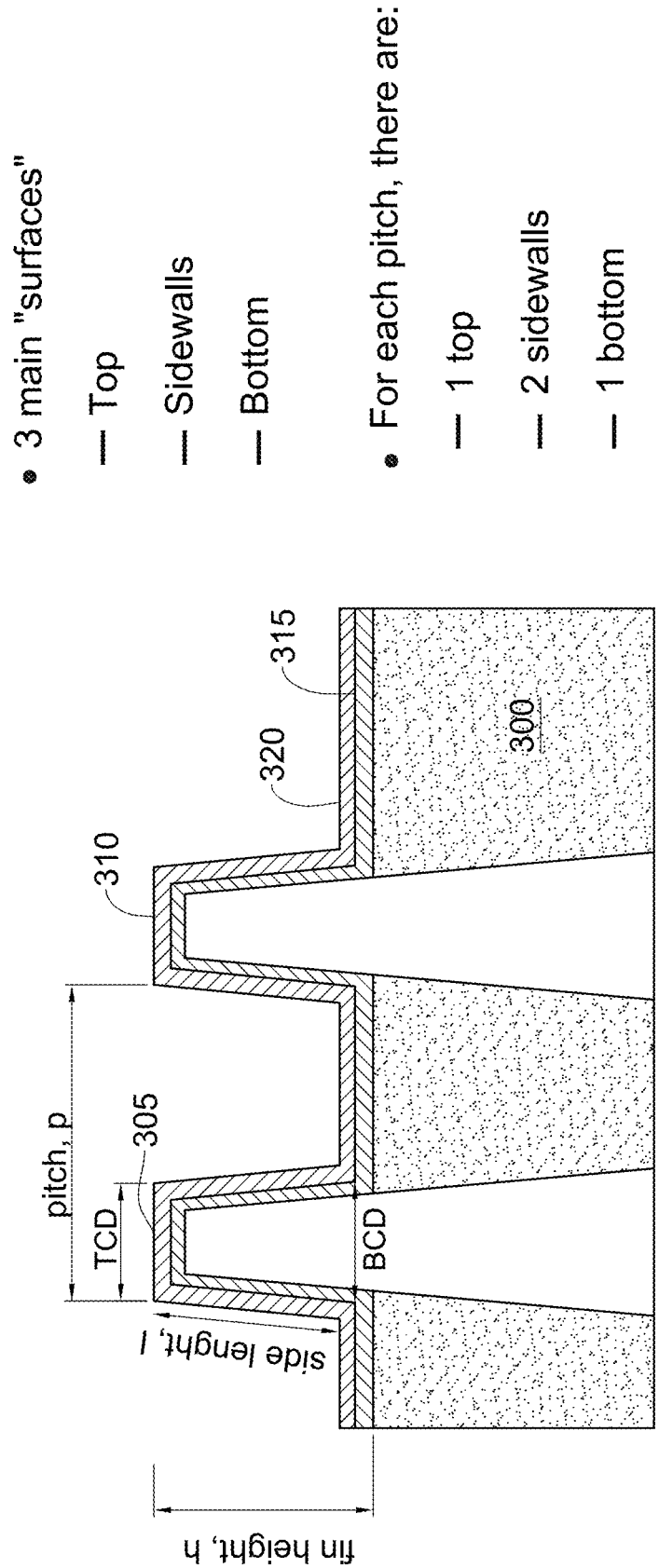
FIG. 3 illustrates two thin layers over a substrate having uneven topography.

According to one embodiment of the invention, electron spectroscopy and/or x-ray fluorescence is used to determine the thickness and/or composition of one or more layers in a single or multi-layer structures on a substrate. The thickness may be determined by measuring the intensities of two electron/x-ray species emitted by the structures when bombarded with photons, electrons, etc. A predictive intensity function that is dependent on the thickness of a layer is determined for each electron/x-ray species. A ratio of two predictive intensity functions is formulated, and the ratio is iterated to determine the thickness of a layer of the structure. According to one embodiment, two (or more) electron/x-ray species may be measured from a single layer to determine a thickness and/or composition of that layer. According to another embodiment, two electron/x-ray species from different layers or from a substrate may be measured to determine a thickness and/or composition of the layer. Several techniques for determining the thickness and/or composition of different layers in different configurations are described below.

For measurements that are done over patterned areas, the intensity measurement is then "normalized" or "calibrated" using topographical information of the structures of the patterned area. The topographical information may be in the form of, for example, data obtained from a CAD file of the device's design, from a critical dimension (CD) measurement tool, such as CDSEM, OCD, AFM, etc. Data relevant to the calibration may include CD at the top of a feature, CD at the bottom of a feature, height of the features, pitch, etc. According to a feature of the invention, this data may be used to generate one or more calibration coefficients that are then used to normalize the XPS/XRF data. For example, one calibration coefficient may be correlated to the top CD, one calibration coefficient may be correlated to the bottom CD, one calibration coefficient may be correlated to the feature's height, one calibration coefficient may be correlated to the pitch, etc. Depending on the device's design, one or more of these coefficients may be used.

An elemental species refers to the chemical composition of a specific layer or the substrate. For example, a hafnium oxide layer includes the elemental species of hafnium and oxygen. Another example would be a SiGe layer that includes the elemental species of Si and Ge. An electron/x-ray species refers to an electron/x-ray having a characteristic energy. A single elemental species may emit several different electron species. For example, a silicon substrate may emit two different characteristic electrons having different kinetic energies. One electron may be emitted from the 2p orbital of the silicon atom, while the other electron may be emitted from the 2s shell of the silicon atom. An electron signal hereinafter refers to a stream of electrons belonging to a specific electron species. For example, the 'Hf4f signal' comprises the electrons emitted by the 4f orbital of hafnium. Another example would be the 'GeLα signal' which comprises x-rays from the Lα x-ray emission from Ge. Many of the examples discussed below refer to photoelectrons, or electrons that are emitted when a layer is bombarded with photons. Each elemental species may emit one or more photoelectron/x-ray species, which may comprise a photoelectron/x-ray signal.

FIGS. 1A-1D illustrate two multi-layer structures and the intensities of different electron signals emitted by the structures when subjected to photoelectron spectroscopy. FIG. 1A illustrates a multi-layer structure 100 having three layers 102, 104, and 106 formed on a substrate 108. Each of the layers 102, 104, and 106, and the substrate 108, emit electrons having a characteristic kinetic energy (KE) when bombarded with energetic particles, such as photons or electrons. FIG. 1B is a graph 110 showing the intensity of an electron species emitted by each layer of the structure 100. FIG. 1C illustrates a multi-layer structure 120 having three layers 122, 124, and 126 formed on a substrate 128. FIG. 1D is a graph 130 showing the intensity of an electron species emitted by each layer of the substrate 120.

In embodiments disclosed in more details below the thickness or composition of a layer in a structure may be determined by generating a ratio of two predictive intensity functions of electron signals. As will be explained below, the predictive intensity functions are dependent on the thickness of the layer that produces the electron. A ratio of two predictive intensity functions is used to allow for variances in the intensity of the beam used to generate the electrons, and other factors that may change the relative intensities of electron or x-ray signals. Once the ratio including the predictive intensity functions for the emitted electrons is determined, the measured intensities of those electron signals is inputted, and using iteration or other techniques, the thickness of a layer can be determined. Various examples below describe different scenarios for determining thicknesses and/or composition.

Photoelectron spectroscopy is a technique used to determine the composition and electronic state of a sample. Photoelectron spectroscopy measures photoelectrons that are emitted by a sample that has been bombarded by essentially monochromatic (or of narrow line width) sources of radiation. For example, the sample may be bombarded with x-ray or ultraviolet radiation having a specific, predetermined wavelength. When the individual atoms of the sample absorb the photons of the radiation, the atoms emit an electron having a kinetic energy (KE) characteristic of the atom. This electron is known as a photoelectron. The photon absorbed by the atom has an energy e=hv. The photoelectron is an electron that was once bound to the emitting atom. The binding energy (BE) of the photoelectron is the amount of energy required to strip the photoelectron from the atom. The KE measured by the equipment is the amount of energy the photoelectron has after being emitted. Because of the law of conservation of energy, it can be determined that KE=hv−BE. As the BE for an electron in an atom has a known value, if the wavelength of the photon striking the sample is known, the KE of an emitted photoelectron can identify the species of the photoelectron.

Auger electron spectroscopy exposes a sample to a beam of electrons having sufficient energy to ionize atoms, thereby causing an atom to emit an Auger electron. When an atom is exposed to the beam, a first electron is removed from a core level of the atom, creating a vacancy. An electron from a higher level of the atom fills the vacancy, causing a release of energy. The released energy is carried off with an ejected Auger electron. The Auger electron, and the intensity of an Auger electron signal can be measured in the same way that the photoelectron signal is measured. It is understood that wherever photoelectrons are mentioned herein, Auger electron species may also be measured and used to determine thicknesses. Additionally, other electron species that have a characteristic energy and whose intensities may be measured may also be used with embodiments of the invention.

The emitted photoelectrons can be counted using an electron energy analyzer. A spectrum plotting the number of photoelectrons counted at specific kinetic energies can be generated from the raw data. The spectrum can then be used to determine various characteristics, such as the composition or the thickness, of the sample. According to one embodiment of the invention, constant-angle (e.g., the x-ray source remains at a constant angle) spectroscopy is used to determine layer thickness.

X-ray photoelectron spectroscopy (XPS) is photoelectron spectroscopy using an x-ray source. Using XPS or similar techniques, one may determine the thickness of the layers 102, 104, 106, 122, 124, or 126. In order to determine the thickness of the layer 102, the structure 100 is bombarded with x-ray wavelength photons from an x-ray source to stimulate the emission of a characteristic photoelectron using the photoelectric effect. When a photon having a specific wavelength is absorbed by an atom in a molecule or solid, a core (inner shell) electron having a specific, characteristic energy for that species is emitted. The kinetic energy of the emitted photoelectrons can be used to determine the thickness and other characteristics of the layer that generated them.

The various layers of the structures 100 and 120 each have corresponding elemental species. For example, the layer 102 and the layer 122 have the same elemental species, the layer 104 and the layer 124 have the same elemental species, and the layer 106 and the layer 126 have the same elemental species. Since the elemental species of the layers 102 and 122 is the same, the layers 102 and 122 will emit photoelectrons having the same characteristic KE. The two structures 100 and 120 are identical except for the thickness of the middle layers of each (i.e., the layers 104 and 124). While the layers 102 and 122 have the same thickness, and the layers 106 and 126 have the same thickness, the layer 104 is thicker than the layer 124. This is significant since the intensity of photoelectrons emitted by buried layers is attenuated by the layers above them.

As shown in FIGS. 1B and 1D, the intensity 112 of the photoelectron signal emitted by the layer 104 is greater than the intensity 132 of photoelectron signal emitted by the layer 124. All of the photoelectrons emitted by the layers 104 and 124 have the same kinetic energy, however, the thicker layer 104 emits more photoelectrons (i.e., has a higher intensity), which indicates that the layer 104 is thicker than the layer 124. Since a predictive intensity function that is dependent on the thickness of the layer can be formulated for each photoelectron species, the measured intensity of the photoelectrons can be used to determine the thickness of the various layers of the structures 100 and 120.

As can be seen in FIGS. 1B and 1D, the intensities 118 and 138 of the signals emitted by the layers 102 and 122 are the same. This is because the layers 118 and 138 have the same thickness, and because the signals emitted by the layers 118 and 138 are not attenuated by an overlayer. The intensity 136 of the signal emitted by the substrate 128 is greater than the intensity 116 of the signal emitted by the substrate 108. This is because the signal emitted by the substrate 108 is more attenuated than the signal emitted by the substrate 128. The substrates 108 and 128 are considered to be infinitely thick (i.e., they have a thickness greater than four times the wavelength of the incoming photons) and will therefore produce approximately the same number of characteristic photoelectrons under the same conditions. The thicker layer 104 attenuates the signal emitted by the substrate 108 more than the thinner layer 124 attenuates the signal emitted by the substrate 128. For the same reason, even though the layers 106 and 126 have the same thickness, the intensity 114 of the signal emitted by the layer 106 is less than the intensity 134 of the signal emitted by the layer 126. The intensity 112 of the signal emitted by the layer 104 is greater than the intensity 132 of the signal emitted by the layer 124 since the layer 104 is thicker than the layer 124, and a thicker layer emits more photoelectrons.

FIGS. 2A-C describe a process for determining a thickness of a single layer over a substrate using an electron signal from the layer and an electron signal from the substrate. FIG. 2A illustrates a layered structure formed on a substrate and investigated according to one embodiment of the invention. For simplicity of explanation, in this example there is only one thin layer deposited over the substrate, but the way to generalize the method for more layers will be described further below. The discussion regarding FIG. 2A provides a general formulation of a ratio used to determine a thickness of a single flat layer, i.e., without any topographical structures. FIG. 2A shows a structure 200 including a layer 202 formed on a silicon or other substrate 204 which may represent a portion of a larger micro-electronic device. The thickness of the layer 202 may be measured using X-Ray Photoelectron Spectroscopy (XPS) or similar techniques, such as Ultraviolet Photoelectron Spectroscopy (UPS), Auger spectroscopy, etc.

FIG. 2B is a flowchart describing a process for determining a thickness of a single layer over a substrate. The process illustrated in FIG. 2B may be executed by a module, which may be implemented in hardware, software, or a combination of hardware and software. As such, the process of FIG. 2B may be implemented as a machine readable medium having stored thereon executable program code which, when executed, causes a machine to perform a method of FIG. 2B. The module or machine readable medium may reside in a computer independent of the metrology tool, or may be part of a CD, XPS, or other metrology tools.

The process 220 uses two electron signals (one from the layer 202 and one from the substrate 204) to determine the thickness of the layer 202. The intensities of the two electron signals are first measured. Predictive intensity functions dependent on the thickness of the layer 202 are determined. A ratio of the two functions (one predicting the intensity of the signal from the layer 202, the other predicting the intensity of the signal from the substrate 204) is generated, and the thickness of the layer 202 is extracted from the ratio. This will be explained in more detail below.

Referring back to FIG. 2A, the structure 200 includes the substrate 204 that forms the basis for the structure 200 and may be formed from, e.g., single-crystal silicon. The layer 202 is formed over the substrate 204. The layer 202 in this example may be, e.g., a Hafnium Oxide (HfO$_2$) layer. Although specific examples of layer species are used herein, it is understood that any layer material may be used with embodiments of this invention.

Generally, the thickness of the layer 202 can be determined by taking a ratio of the intensities of two measured signals of photoelectrons emitted by the layer 202 and the substrate 204. A hafnium atom, when bombarded with x-ray wavelength photons 206 generated by an x-ray source 208, emits a characteristics photoelectron signal 210 comprising photoelectrons (for example) from the 4f orbital. The x-ray source 208 may include, for example, an electron gun to direct electrons at an anode to generate x-ray photons, and a lens to focus the x-ray photons on the structure 200. The photoelectrons comprising the signal 210 have a characteristic kinetic energy that is measured and counted by an electron energy analyzer 212. The substrate 202 also emits a characteristic signal 214 comprising photoelectrons emitted by the Si2p shell and influenced by the Si—Si bond (the "SiO" photoelectron). The signal 214 is also measured by the analyzer 212. One or both of the signals 210 or 214 may also comprise Auger electrons or other ejected characteristic energy electrons. For example, the signal 210 may be an Auger electron signal, while the signal 214 is the SiO photoelectron signal.

The analyzer 212 returns the measured results to a processing system 216. The processing system 216 may be a personal computer (PC) such as those having Intel® processors, and may interface with the analyzer 212 through a universal serial bus (USB) connection. The measured results are processed by the processing system 216 and returned to a user.

FIG. 2C illustrates a spectrum 240 of the measured results generated by XPS spectroscopy. The spectrum 240 shows a number of counts per second measured along the y-axis 242, and a kinetic energy (KE) of the measured-photoelectrons along the x-axis 244. The spectrum 240 shows two peaks, 246 and 248, corresponding to the measured signals 212 and 210, respectively. The number of counts as shown in the peaks 246 and 248 is used to determine the intensity of the signals 210 and 212. The peak 246 may have a lower bound 250 and an upper bound 252. The number of counts falling between these bounds determine the intensity of the SiO species (i.e., more counts equals higher intensity), which is then used to determine the thickness of the layer 202. The peaks 246 and 248 may also be manipulated (e.g., shaped or fitted) or have background noise removed using standard techniques such as background subtractions.

The intensities of photoelectrons characteristic to a layer (e.g., the layer 202) can be predicted using formulae that depend on the layer thickness and the attenuation of the signals in a film for a given electron analyzer geometry, x-ray source to analyzer angle, operating condition, and x-ray flux of given energy. The process 220 shown in FIG. 2B described determining layer thickness using an electron species from the layer 202 and an electron species from the substrate 204. In block 222, the intensities of the two electron signals 210 and 214 are measured using the analyzer 212 shown above. In block 224, a predictive intensity function for the signal 210 is determined. Equation (1) can be used to determine the intensity of a signal that is not attenuated (i.e., a signal emitted by the top layer of a structure):

$$I(X_i) = I_{infXi} * \left[1 - e^{\frac{-tx}{\lambda Xi(X)}}\right] \quad (1)$$

Where X is an elemental species, $X_i$ is the photoelectron species emitted by the species X which is being measured, $I(X_i)$ is the intensity of the photoelectron signal, $I_{infXi}$ is the intensity of a photoelectron signal emitted by a thick layer (i.e., greater than 10 nanometers (nm) or having thickness at least four times larger than the photoelectron species wavelength), $t_x$ is the thickness of the layer emitting the signal, and $\lambda_{Xi(X)}$ is the electron attenuation length (EAL) of the photoelectron species ($X_1$) in a layer X. An EAL is a measured quantity equal to the distance over which a photoelectron's original intensity drops to 1/e. EALs may be determined using, for example, the National Institute of Science and Technology's (NIST) EAL program. For example, the intensity of the signal 210 emitted by the layer 202 can be predicted using equation (1), wherein the predicted intensity of the photoelectron signal equals the intensity of a photoelectron signal emitted by a thick layer, multiplied by a factor having a magnitude dependent on a ratio of the thickness of the layer to the electron attenuation length (EAL) of the photoelectron species in that layer.

In block 224, a predictive intensity function for the signal 214 is determined. The intensity of the signal 214 emitted by the substrate (or underlayer) 204 of thickness $t_x$ is attenuated by the layer 202, and therefore may be predicted using equation (2):

$$I(X) = I_{infX} * \left[1 - e^{\left(\frac{-t_X}{\lambda_{X(X)}}\right)}\right] * e^{\frac{-t_y}{\lambda_{X(Y)}}} \quad (2)$$

Where I(X) is the intensity of a photoelectron signal comprising a photoelectron species X and attenuated by an overlayer Y of thickness $t_y$, $\lambda_{X(Y)}$ is the EAL of photoelectrons emitted by the species X in the layer Y, and $\lambda_{X(X)}$ is the EAL of photoelectrons emitted by the species X in the layer X. That is, the predicted intensity of the photoelectron signal from the substrate equals the intensity of a photoelectron signal emitted by a thick layer (e.g., substrate), multiplied by a factor having a magnitude dependent on a ratio of the thickness of the layer to the electron attenuation length (EAL) of the photoelectron species in that layer, and further multiplied by a factor having a magnitude dependent on the thickness of the overlayer to the EAL of photoelectrons emitted by the species X in the overlayer. In the limit of a very thick layer or substrate, for which tx is very large, the second term in the equation approaches 1, and thus can be omitted from the equation.

In order to determine the thickness of the layer 202, the ratio of the intensities of the two signals 210 and 214 is determined in block 228. A ratio is used because the specific intensities measured by the analyzer 212 change from measurement to measurement and depend on the x-ray wavelength used and other factors. The ratio of the intensities of the signals 210 and 214 for the example of layers with elemental Hafnium, oxide and Silicon substrate (or thick layer) may be given, for example, by equation (3):

$$\frac{I(SiO)}{I(Hf4f)} = \frac{I_{infSi} * e^{\frac{-t_{Hf}}{\lambda_{Si(HfO_2)}}}}{I_{InfHf} * \left(1 - e^{\frac{-t_{Hf}}{\lambda_{Hf(HfO_2)}}}\right)} \quad (3)$$

Equation (3) may be solved iteratively to determine the thickness $t_{Hf}$ using a program such as Matlab® in block 230. I(Hf4f) is the measured intensity of photoelectrons emitted by the 4f shell of hafnium (i.e., the signal 210 and the peak 228), while I(SiO) is the measured intensity of photoelectrons emitted by the substrate 202. $I_{(infHf)}$ and $I_{(infSi)}$ are the measured intensities of a photoelectron emitted by a thick (e.g., greater than 10 nm) layer of hafnium oxide and silicon, respectively. $\lambda_{Si(HfO2)}$ and $\lambda_{Hf(HfO2)}$ are the measured electron attenuation lengths (EALs) of silicon and hafnium photoelectrons emitted by the substrate 204 and the layer 202. The intensity of the silicon signal 214 is attenuated by the layer 204.

Note that in this example, since the substrate is thick, the second term from equation (2) has been omitted. Consequently, the ratio of the measured intensity of photoelectrons emitted by element $x_i$ in the substrate to the measured intensity of photoelectrons emitted by element $x_j$ in the overlayer equals the ratio of the measured intensities of a photoelectron emitted by element $x_i$ in a thick layer as modified by a first factor, to the measured intensities of a photoelectron emitted by element $x_j$ in a thick layer as modified by a second factor, wherein the first factor correlates with a ratio of the thickness of the overlayer to the EALs of element $x_i$ in the overlayer; while the second factor correlates with a ratio of the thickness of the overlayer to the EALs of element $x_j$ in the overlayer.

So far, the process has been described without regards to the topography of the sample. In essence, the model assumes a flat topography. However, XPS measurements are increasingly important for the fabrication of electronic devices, where the area measured is not flat, but rather has varied or undulated topography. Generalizing, the topography has hills and valleys with repetitive pitch. In one example, such topography may be modeled and referred to as trapezoidal fin structure, as shown in FIG. 3. In the example of FIG. 3, a bulk layer, e.g., mono-silicon substrate 300 is covered with trapezoidal structures, only two of which 305 and 310 are shown for demonstration. The entire surface is covered with a first thin layer 315, e.g., hafnium oxide, and a second thin layer 320, e.g., silicon oxide. The objective is to determine the thickness and composition of each of the thin layers. However, attempting to use XPS in the standard method would lead to error, since the photon emission from different parts of the trapezoids is different from emission from a flat surface.

In order to properly account for the varying photon emission, the topography is characterized by several parameters, such as, e.g., fin height, width of each fin at the top (top critical dimension—TCD), width of each fin at the bottom (bottom critical dimension—BCD), side length—a function (L), and pitch (which is the repetition length of the fins). Thus, as shown in FIG. 3, the intensity contribution of a repetitive structure (e.g., fin) is composed of the intensity contribution from the top of the structure, twice the contribution from the sloping sides (there are two sides), and the contribution from the bottom.

In one embodiment, the topography parameters are used to generate coefficients which are used to calibrate the XPS model. In one particular example three coefficients are used: top coefficient, sidewall coefficient, and bottom coefficient. Also, a pitch coefficient may be used. FIGS. 4A and 4B illustrate an embodiment for generating the coefficients, in this example for hafnium, silicon oxide, and silicon, per the example of FIG. 3, while FIG. 4C illustrates another example. In FIG. 4B the "a" and "b" parameters are the relative production and collection efficiency of the photoelectrons for the side of the fins and the bottom, respectively. According to one embodiment, the "a" and "b" parameters need to be calibrated using reference data with known structure parameters.

The $1/K_X$ factors shown in FIG. 4A are essentially the $I_{infX}$ factors presented previously, in all cases representing the effective relative signal strength for photoelectron production of species X for the planar equivalent case.

As shown in FIG. 4B, the structure constants $G_{Top}$, $G_{Sidewall}$, $G_{Bottom}$ are the critical signal intensity scaling factors that encode the relative strengths of the signals as they relate to the geometry of the fins compared to a nominal planar film. For example, $G_{Top}$=p/TCD where p is the pitch of the periodic structure, and TCD is the top width of the fin (also referred to as top critical dimension). Thus, the signal emitted from the top of the fin is a fraction of a nominal planar film in proportion to p/TCD. In the limiting case where TCD=0, $G_{Top}$ approaches infinity and the effective signal from the top of the fin goes to zero. When p=TCD, $G_{Top}$=1, reducing to the planar film equivalent signal contribution.

Similarly, for $G_{Bottom}$ the fraction of signal emitted from the bottom region of the fin is of fraction p/(p-BCD) relative to the nominal planar film case, multiplies by calibration parameter b. The limiting cases where p=BCD and $G_{Bottom}$ approaches infinity (no signal from the bottom region) and BCD=0 and $G_{Bottom}$=1 (planar equivalent) is evident.

Finally, for $G_{sidewall}$ the fraction of signal emitted from the side region of the fin scales with the effective length of the sidewall which is in turn related to the difference between the top (TCD) and bottom (BCD) widths of the fin and the height h of the fin. This is modified by calibration parameter a. The limiting cases where p=BCD and $G_{Bottom}$ approaches infinity (no signal from the bottom region) and BCD=0 and $G_{Bottom}$=1 (planar equivalent) is evident.

The final signal contribution for each species shown in FIG. 4A is therefore a sum of the individual signals coming from the three different regions of the fin and their respective contributions each scaled by their respective constants $G_{Top}$, $G_{Sidewall}$, $G_{Bottom}$.

As also shown in FIG. 4B, when the aspect ratio of the fins is low, i.e., the height of the sides of the fins is small compared with the width of the bottom of the fins, the calibration parameter b is approximately equal to 1, so that it may be dropped and only calibration parameter a used. This is because the contribution of the wide bottom can be approximated by a flat surface; however the contribution of the sides needs to be calibrated by calibration parameter a. FIG. 4B also indicates the constraints that the pitch is larger than the bottom CD—which is the case for any repetitive structure by definition. Also, the top CD is taken to equal or be smaller than the bottom CD. Parameter b is set to one when the height h, shown in FIG. 3, is much smaller than the bottom CD and the pitch p.

An alternative model is also presented in FIG. 4C, that leads to slightly different relationships for the $G_{Top}$, $G_{Sidewall}$, $G_{Bottom}$ factors. In the case where the finite thickness of the films need to be considered for improved accuracy of the model, the $G_{Top}$, $G_{Sidewall}$, $G_{Bottom}$ factors now contain an explicit thin film dependence and the model may use four calibration parameters. In the examples of FIGS. 4A-4C, the calibration parameters a-d may be different for each element.

The parameters of the sample can be obtained in many ways; either derived from design data or measured using metrology equipment. As shown in FIG. 5, according to one example, the parameters are obtained using optical measurement of the sample, e.g., optical CD tool, such as the Nova T600, available from Nova Measuring Instruments of Rehovot, Israel.

The process illustrated in FIG. 5 may be executed by a module, which may be implemented in hardware, software, or a combination of hardware and software. As such, the process of FIG. 5 may be implemented as a machine readable medium having stored thereon executable program code which, when executed, causes a machine to perform a method of FIG. 5. The module or machine readable medium may reside in a computer independent of the metrology tool, or may be part of a CD, XPS, or other metrology tools. Also, in FIG. 5, the double-headed arrow indicates processes that may be performed iteratively.

In another embodiment, the topography may be nonperiodic (consistent with real device layout where an XPS measurement might take place). Such topography can be derived or measured from CAD, GDS II layout, and/or material and thickness information for different layers measured at the current or previous steps of the process. Such non-periodic topography may also be characterized by a "top", "side" and "bottom" production of electrons, or other, more complex combination of coefficients depending on the layout complexity. The relative electron contribution of different aspects of the structure can then be similarly summed up to account for the electron signals collected and enable correct measurement of the thin layers around that structure.

In yet another embodiment, concurrent or iterative spectrum interpretation and optimization is performed on the OCD spectra (to extract the geometrical profile including topography of the structure and thin film layers) and XPS signals that use the topography to refine extraction of thin film layers covering partially or fully the topography. The topography extracted from OCD (consistent with measured spectra) would constrain the XPS interpretation to a specific result for the thin layer thickness and/or composition, which in turn would put further constraints on the OCD-extracted topography. This method further minimizes possible crosstalk errors between geometrical profile parameters (topography and thin films).

Figure 6:
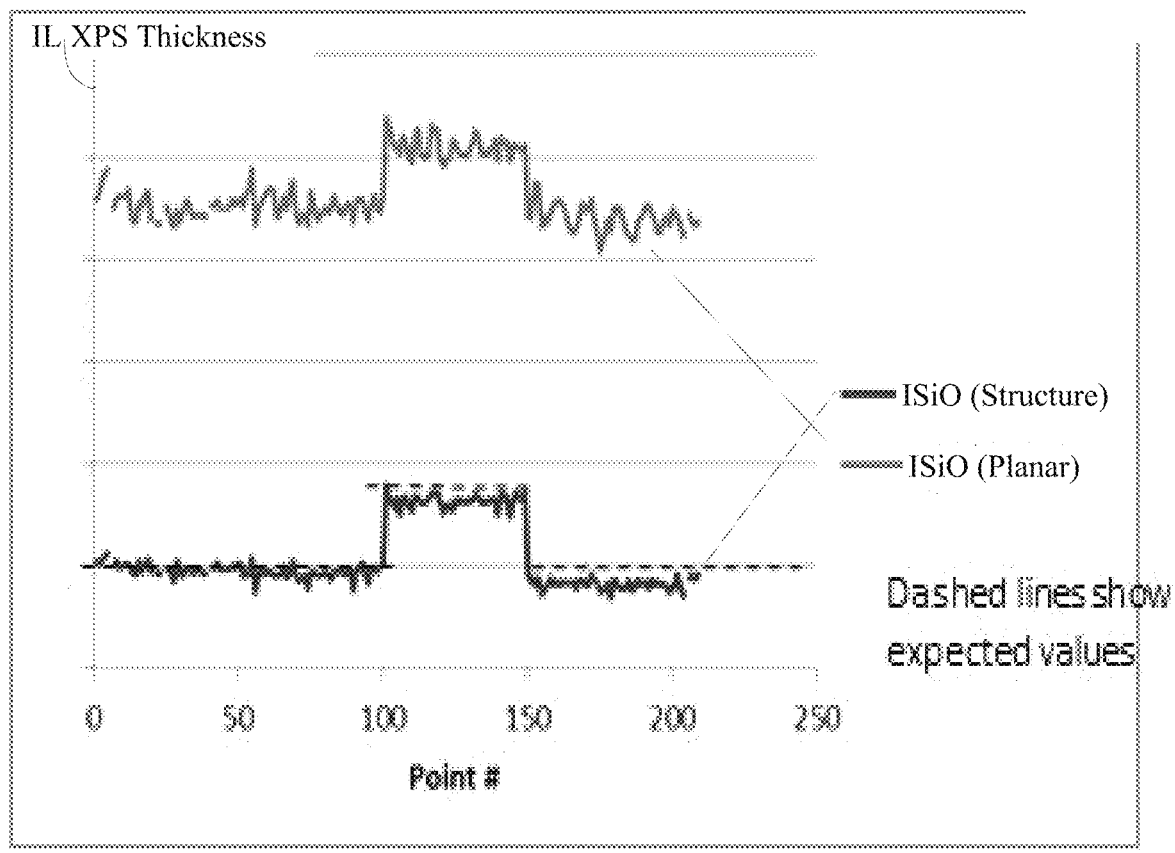
FIG. 6 is a plot of data obtained using embodiments of the invention, with and without the use of the coefficients.

FIG. 6 is a plot of data obtained using embodiments of the invention. The top plot illustrates plot of the data calculation obtained without using topography parameter coefficients, i.e., using the modeling of flat surface, while the bottom is a plot of the data calculation using the topography parameter coefficients to improve on the results of the top plot. The horizontal dashed lines indicates the expected value from knowledge of the actual structure. It can be seen that using the parameters dramatically improves on the data calculation.

Turning back to FIG. 5, it exemplifies a hybrid metrology technique. In this example, optical measurements (e.g. OCD) are used for optimizing interpretation of XPS/XRF measurements. More specifically, OCD measurements and XPS/XRF measurements are independently (concurrently or not) applied to the same sample (IC), and OCD measured data and XPS/XRF measured data are independently obtained. The OCD data and XPS/XRF data are analyzed using model-based fitting procedures, and via mutual optimization of the OCD and XPS/XRF data interpretation models (i.e. injection of one or more parameters obtained from the OCD data into XPS/XRF model and vice versa), optimized geometrical (e.g. thickness) and material composition parameters of the sample are determined.

Reference is now made to FIGS. 7A and 7B schematically illustrating one more example of the hybrid measurement technique of the present invention for measuring in complex structures/samples including elemental species.

FIG. 7A is a block diagram of a hybrid measurement system 700. The system 700 is generally a computer system including inter alia data input and output utilities 702, 704; a memory utility 706; and data processor and analyzer utility 708. The system 700 is configured for receiving measured data obtained from a sample by different measurement tools/systems including an optical measurement system 710 (e.g. configured for performing OCD measurements), and XPS and XRF tools 712 and 714. It should be understood that the system 700 may be part of (directly connected to) either one of the measurement tools 710-714 or all of them; or may be a stand-alone system in data communication (e.g. via a communication network) with the measurement systems/tools; or configuration may be such that the system 700 receives measured data of at least one or all of the three types from storage device(s). Thus, generally, blocks 710, 712 and 714 present measured data provider utilities 716 from which system 700 receives, respectively, OCD measured data, XPS measured data and XRF measured data.

FIGS. 7B and 7C exemplify a layout of a modeled complex patterned structure 800 under measurements. The modeled structure includes floating parameter(s) $P_1$, fixed parameter(s) $P_2$ (typically Si layer), and parameter(s) $P_3$ which is/are floating but such that measured radiation response from the structure has zero (or almost zero, negligible) sensitivity to variation of these parameters.

The system 700 is configured and operable to integrate XPS, XRF and optical OCD measured data into unified solution. Combination of these measured data provides complimentary sensitivity to parameters of interest (e.g. composition and thickness of one or more layers). Turning back to FIG. 7A, system 700 receives optical measured data $MD_{OCD}$, $MD_{XRF}$ and $MD_{XPS}$, which data is stored and processed and analyzed. To this end, the data processor and analyzer 708 includes respective analyzer modules, and a combined data interpretation module, the operation of which will be described further below.

As known, XRF measurement is sensitive to overall Ge dose in the structure 800. Also, as described above, XPS measurements is preferentially sensitive to surface layers and under-layer composition, which in this case, is a thin cap-Si layer, and the L2 Ge % layer. As for the OCD measurement, it is preferentially sensitive to the total optical thickness of the combined cap/Si layer, L2 Height/Ge %, and L1 height/Ge %. Combination of these technologies shows complimentary sensitivity to composition and thickness of the layers. Using all three technologies simultaneously in a regression in MARS allows to determine the critical parameters of interest.

For the present eSiGe example, the critical parameter of interest is the thickness/height of bottom SiGe layer L1. However, OCD measurement has reduced sensitivity to the bottom SiGe layer because contribution of optical response of this thin and buried layer to the entire OCD measured signal/data is relatively small. XRF measurement is sensitive to the total Ge 'dose', and therefore a single gain and offset (a,b) is able to relate the volume of L1 to the XRF counts and the Ge % of L1 and L2 in a complimentary way to OCD:

$$[XRF(counts)/a+b]=V\_L1*Ge\%\_L1+V\_L2*Ge\%\_L2$$

However, this solution still relies on fixing the Ge % of both L1 and L2. XPS measurement allows to solve this problem: if the cap-Si thickness are known (or fixed), XPS can determine the Ge % of the top L2. Thus, the combination of XRF and XPS provides for determining L2 (assuming Ge % of L1 is fixed).

Both, the XRF and XPS measured data are used to enforce a constraint among the parameters during the regression process. For XRF, it is relatively straightforward, i.e. a linear combination of XRF signal and parameters with a,b calibration factors. For XPS, the injection involves self-consistently solving the equation for Ge % of L2 by using the XPS signal, parameters including cap-Si thickness, essentially constraining cap-Si and Ge % of L2 during the regression process:

$$I_{Si} = \frac{1}{K_{Si}} \left( \left[ 1 - e^{\frac{-t_{SiCap}}{\lambda_{Si,SiCap}}} \right] \overset{Si\ signal\ from\ SiCap}{} + (1-f)e^{\frac{-t_{SiCap}}{\lambda_{Si,SiCap}}} \overset{Si\ signal\ from\ SiGe}{} \right)$$

$$I_{Ge} = \frac{f}{K_{Ge}} e^{\frac{-t_{SiCap}}{\lambda_{Ge,SiCap}}}$$

Where f is the Ge fraction in SiGe; $t_{SiCap}$ is SiCap thickness; $\lambda_{Si,SiCap}$ is the effective attenuation length; and K is the material constant; and accordingly we have:

$$\frac{I_G}{I_{Si}} = \frac{\frac{f}{K_{Ge}} e^{\frac{-t_{SiCap}}{\lambda_{Ge,SiCap}}}}{\frac{1}{K_{Si}} \left( \left[ 1 - e^{\frac{-t_{SiCap}}{\lambda_{Si,SiCap}}} \right] + (1-f)e^{\frac{-t_{SiCap}}{\lambda_{Si,SiCap}}} \right)}$$

Thus, injection of XRF and XPS parameters for optimizing the OCD data interpretation model, provides for optimizing the calculation of the results for the geometrical and material-related parameters of the structure.

Figure 8:
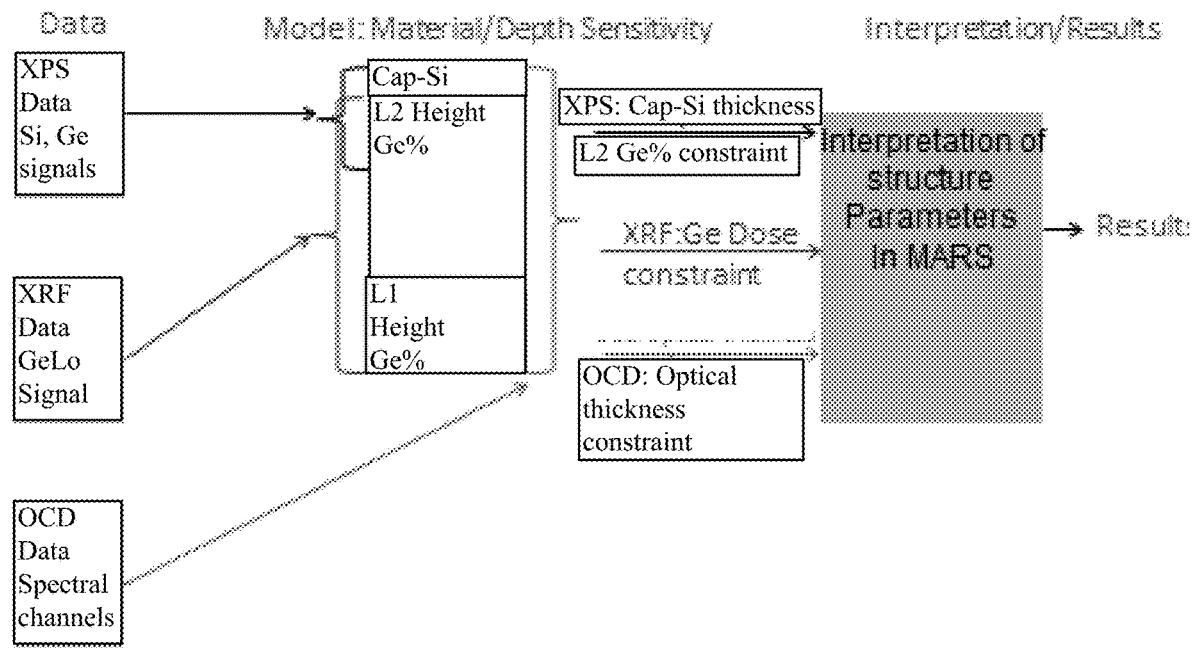
FIG. 8 is a flow diagram of an example of the model sensitivity optimization using the hybrid measurement technique and the operation steps in the analyses and interpretation of the measured data based on this model optimization.

Reference is made to FIG. 8 illustrating, by way of flow diagram, the model sensitivity optimization using the above three independent types of measurements and the operation steps in the analyses and interpretation of the measured data based on this model optimization. As shown in the figure, the modeled structure is a three layer structure/stack of layer L1 (Height Ge %), layer L2 (Height GE %) and cap-Si. The XPS measured data $MD_{XPS}$ is indicative of the Si and Ge signals in the radiation response of the layer L2 and cap-Si structure; XRF measured data $MD_1$ is indicative of GeLα signal in the radiation response of L1 and L2 structure; and OCD measured data $MD_{OCD}$ is indicative of a spectral response of the entire modeled stack.

Thus, the XPS data analyzer extracts, from the measured data $MD_{XPS}$, the cap-Si thickness and L2 Ge % constrain and provides data indicative thereof to the combined data interpretation module. The XRF data analyzer extracts, from the measured data $MD_{XRF}$, the Ge dose constrain and provides data indicative thereof to the combined data interpretation module; and the OCD data analyzer determines, from the measured data $MD_{OCD}$, the total thickness constrain and conveys respective data to the combined data interpretation module. The latter process the received data by applying thereto regression algorithm, and calculates the parameter of interest.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

We claim:

1. A method for determining at least one property of an integrated circuit (IC) comprising a structure, the method comprises:
    illuminating the structure with an x-ray beam, during an execution of a measurement selected out an x-ray photoelectron spectroscopy (XPS) measurement and an x-ray fluorescence spectroscopy (XRF) measurement; wherein the structure comprises a layer on top of an underlayer; wherein the layer has an uneven topography and comprises a layer top surface, layer sidewalls that are not parallel to the layer top surface, and a layer bottom surface; wherein the underlayer has an uneven topography and comprises an underlayer top surface, underlayer layer sidewalls that are not parallel to the underlayer top surface and an underlayer bottom surface;
    detecting layer emitted photoelectrons and underlayer emitted photoelectrons; wherein the detected layer emitted photoelectrons comprise photoelectrons emitted from the layer top surface and photoelectrons emitted from the layer sidewalls; wherein the detected underlayer emitted photoelectrons comprise photoelectrons emitted from the underlayer top surface and photoelectrons emitted from the underlayer sidewalls;
    determining a layer intensity function for the layer emitted photoelectrons, wherein the layer intensity function is responsive to photoelectrons emitted from the layer top surface, to photoelectrons emitted from the layer sidewalls, to photoelectrons emitted from the layer bottom surface and to layer coefficients that accommodate for the uneven topography of the layer; wherein the determining of the layer intensity function is based, at least in part, on one or more optical critical dimension (OCD) measurement obtained dimensions of the structure;
    determining an underlayer intensity function for the underlayer emitted photoelectrons, wherein the underlayer intensity function is responsive to photoelectrons emitted from the underlayer top surface, to photoelectrons emitted from the underlayer sidewalls, to photoelectrons emitted from the underlayer bottom surface, and to underlayer coefficients that accommodate for the uneven topography of the underlayer;
    calculating a ratio between the layer intensity function and the underlayer intensity function; and
    determining a thickness of the layer based on the ratio.

2. The method according to claim 1 wherein the determining is executed in an iterative manner.

3. The method according to claim 1, wherein the layer coefficients are indicative of differences in relative strengths between detected photoelectrons that were emitted from the layer top surface, detected photoelectrons that were emitted from the layer sidewalls and detected photoelectrons that were emitted from the layer bottom.

4. The method according to claim 1, wherein the layer coefficients comprise a layer top surface coefficient, a layer sidewalls coefficient and a layer bottom surface coefficient, wherein the underlayer coefficients comprise an underlayer top surface coefficient, an underlayer sidewalls coefficient and an underlayer bottom surface coefficient.

5. The method according to claim 4 wherein the layer comprises multiple repetitions of the layer top surface, the layer sidewalls and the layer bottom surface; and wherein at least one of the layer coefficients is responsive to a pitch of the multiple repetitions.

6. The method according to claim 5, wherein the layer sidewall coefficient is proportional to $p/(\text{square root}\{h^2+0.25*(BCD-TCD)^2\})$, wherein h is a height layer sidewall, TCD is a top critical dimension and BCD is a bottom critical dimension.

7. The method according to claim 1 wherein the obtaining of the layer coefficients comprises calculating at least one of the layer coefficient based, at least in part, on the one or more OCD measurement obtained dimensions of the structure.

8. The method according to claim 7 comprising performing one or more OCD measurements to obtain the OCD measurement obtained dimensions of the structure.

9. The method according to claim 1 comprising using the thickness of the layer during one or more additional OCD measurements to impose constraints on OCD-extracted topography determined based on the one or more additional OCD measurements.

10. The method according to claim 1 comprising constraining one or more additional XPS measurements by the OCD-extracted topography.

11. A system for determining at least one property of an integrated circuit (IC) comprising a structure, the system comprises:
    optics configured to (i) illuminate the structure with an x-ray beam, during an execution of a measurement selected out an x-ray photoelectron spectroscopy (XPS) measurement and an x-ray fluorescence spectroscopy (XRF) measurement; wherein the structure comprises a layer on top of an underlayer; wherein the layer has an uneven topography and comprises a layer top surface, layer sidewalls that are not parallel to the underlayer top surface and a layer bottom surface; wherein the underlayer has an uneven topography and comprises an underlayer top surface, underlayer layer sidewalls that are not parallel to the underlayer top surface, and an underlayer bottom surface, and to (ii) detect layer emitted photoelectrons and underlayer emitted photoelectrons; wherein the detected layer emitted photoelectrons comprise photoelectrons emitted from the layer top surface and photoelectrons emitted from the layer sidewalls; wherein the detected underlayer emitted photoelectrons comprise photoelectrons emitted from the underlayer top surface and photoelectrons emitted from the underlayer sidewalls;
    a processor that is configured to:
        determine a layer intensity function for the layer emitted photoelectrons, wherein the layer intensity function is responsive to photoelectrons emitted from the layer top surface, to photoelectrons emitted from the layer sidewalls, to photoelectrons emitted from the layer bottom surface and to layer coefficients that accommodate for the uneven topography of the layer; wherein the determining of the layer intensity function is based, at least in part, on one or more optical critical dimension (OCD) measurement obtained dimensions of the structure;
        determine an underlayer intensity function for the underlayer emitted photoelectrons, wherein the underlayer intensity function is responsive to photoelectrons emitted from the underlayer top surface, to photoelectrons emitted from the underlayer sidewalls, to photoelectrons emitted from the underlayer bottom surface and to underlayer coefficients that accommodate for the uneven topography of the underlayer;
        calculate a ratio between the layer intensity function and the underlayer intensity function; and
        determine a thickness of the layer based on the ratio.

12. The system according to claim 11, wherein the processor is configured to determine in an iterative manner.

13. The system according to claim 11, wherein the layer coefficients are indicative of differences in relative strengths between detected photoelectrons that were emitted from the layer top surface, detected photoelectrons that were emitted from the layer sidewalls and detected photoelectrons that were emitted from the layer bottom.

14. The system according to claim 13, wherein the layer comprises multiple repetitions of the layer top surface, the layer sidewalls and the layer bottom surface; and wherein at least one of the layer coefficients is responsive to a pitch of the multiple repetitions.

15. The system according to claim 14, wherein the layer sidewall coefficient is proportional to $p/(\text{square root}\{h^2+0.25*(BCD-TCD)^2\})$, wherein h is a height layer sidewall, TCD is a top critical dimension and BCD is a bottom critical dimension.

16. The system according to claim 13 wherein the processor is configured to obtain the layer topography coefficients by calculating at least one of the layer coefficient based, at least in part, on the one or more OCD measurement obtained dimensions of the structure.

17. The system according to claim 16 wherein the optics is configured to perform one or more OCD measurements to obtain the one or more OCD measurement obtained dimensions of the structure.

18. The system according to claim 11, wherein the layer coefficients comprise a layer top surface coefficient, a layer sidewalls coefficient and a layer bottom surface coefficient; wherein the underlayer coefficients comprise an underlayer top surface coefficient, an underlayer sidewalls coefficient and an underlayer bottom surface coefficient.

19. The system according to claim 11, wherein the processor is configured to use the thickness of the layer during one or more additional OCD measurements to impose constraints on OCD-extracted topography determined based on the one or more additional OCD measurements.

20. The system according to claim 19 wherein the processor is configured to constrain one or more additional XPS measurements by the OCD-extracted topography.

* * * * *